(12) United States Patent
Cywar et al.

(10) Patent No.: US 6,207,351 B1
(45) Date of Patent: Mar. 27, 2001

(54) METHOD FOR PATTERN SEEDING AND PLATING OF HIGH DENSITY PRINTED CIRCUIT BOARDS

(75) Inventors: Douglas Adam Cywar, Danbury, CT (US); Elizabeth Foster, Friendsville, PA (US); Stephen Leo Tisdale, Vestal, NY (US)

(73) Assignee: International Business Machines Corporation, Armonk, NY (US); .

( * ) Notice: Subject to any disclaimer, the term of this patent is extended or adjusted under 35 U.S.C. 154(b) by 0 days.

(21) Appl. No.: 08/481,648

(22) Filed: Jun. 7, 1995

(51) Int. Cl.[7] ................................. B05D 5/12; B05D 3/10
(52) U.S. Cl. ........................ 430/311; 430/324; 430/329; 427/98; 427/304
(58) Field of Search ..................................... 430/315, 313, 430/324, 325, 329, 319, 311.1; 427/98, 304, 307

(56) References Cited

U.S. PATENT DOCUMENTS

| | | |
|---|---|---|
| 3,119,709 | 1/1964 | Atkinson . |
| 3,694,250 | 9/1972 | Grunwald . |
| 4,325,990 | 4/1982 | Ferrier . |
| 4,388,351 | 6/1983 | Sawyer . |
| 4,448,804 | 5/1984 | Amelio et al. . |
| 4,574,031 | 3/1986 | Dorey, II et al. . |
| 4,608,275 | 8/1986 | Kukanskis et al. . |
| 4,640,718 | 2/1987 | Alnot et al. . |
| 4,666,739 | 5/1987 | Roubal . |
| 4,748,104 | 5/1988 | Ferrier et al. . |
| 4,761,303 | 8/1988 | Ruszcyk et al. . |
| 4,782,007 | 11/1988 | Ferrier . |
| 4,863,758 | 9/1989 | Rhodenizer . |
| 4,948,707 | 8/1990 | Johnson et al. . |
| 5,374,454 | 12/1994 | Bickford et al. . |

Primary Examiner—Thorl Chea
(74) Attorney, Agent, or Firm—William N. Hogg

(57) ABSTRACT

The method for forming circuitization of the present invention provides a circuitized product which does not have a blanket seed layer and only has seed layer under the metal circuitization. Thus, short circuits between circuit lines are eliminated. It is a further advantage of the method of the present invention that it does not involve stripping portions of the seed layer. The method of the present invention requires less processing steps than conventional methods and employs positive resists which are developable by aqueous alkaline solutions. Specifically, the method of the present invention for forming circuitization in a circuit board comprising the following steps: providing a dielectric substrate; applying a positive photoresist to the dielectric substrate; then exposing the positive resist through art work corresponding to the desired circuit pattern; then developing the resist with an aqueous alkaline solution to form the circuit pattern in the resist; then applying a seeding composition to the patterned substrate of step d; exposing the remaining resist to actinic radiation; developing the remaining acidified resist with an aqueous alkaline solution to remove photoresist not coated with seed to form a seed pattern; and then electrolessly plating metal onto the seed pattern so as to form the metallized circuit pattern.

5 Claims, No Drawings

METHOD FOR PATTERN SEEDING AND PLATING OF HIGH DENSITY PRINTED CIRCUIT BOARDS

BACKGROUND OF THE INVENTION

In conventional methods of forming circuitization by electroless plating onto dielectric materials, a seeding or catalyst layer is first blanket deposited on the substrate. Next a negative resist, typically a photoresist, is applied, over the seed layer and then the photoresist is exposed to light to form polymerized select portions of the resist. The photo resist is then developed using a developer, that is, a solvent which dissolves the unexposed portions of the photoresist and leaves the polymerized portions of the photoresist atop the seed layer. The portions of the photoresist that are removed by the developer correspond to the metal pattern of the circuitization for the circuit board. Typically, several processing steps are performed to accelerate the catalyst, modify the seed layer, etc. Thereafter, metal is electrolessly plated onto the bare, exposed portions of the seed layer, that is, the portions of the seed layer that are not covered by the photoresist. Thus metal is plated in the pattern of the bare seed layer not covered by the photoresist. The polymerized photoresist is then stripped using stripping solvents. As a result, portions of the seed layer, are covered by metal circuitization, while portions of the seed layer are exposed.

After plating, the processor is left with the decision whether to strip the exposed portion of the seed layer, that is the portion of the seed layer not covered by the electrolessly plated metal or permit the entire seed layer to remain. If the entire seed layer remains, the metal in the seed layer often conducts current from one electrical line in the circuit to another electrical line thereby creating a short circuit.

If the exposed portions of seed layer are to be stripped, this will necessitate another processing step. Moreover, the solvents needed to remove the seed layer, for example, alkaline cyanide solutions are typically not environmentally friendly, and such solvents often present disposal problems. Furthermore, such solvents often attack and degrade the circuitry and the dielectric materials.

It would be desirable to have a method for forming circuitization by electrolessly plating that does not leave a blanket seed layer, that is simple and does not require stripping of the seed layer.

SUMMARY OF THE INVENTION

The method for forming circuitization of the present invention provides a circuitized product which does not have a blanket seed layer and only has seed layer under the metal circuitization. Thus, short circuits between circuit lines are eliminated. It is a further advantage of the method of the present invention that it does not involve stripping portions of the seed layer. The method of the present invention requires less processing steps than conventional methods and employs positive resists which are developable by aqueous alkaline solutions. Specifically, the method of the present invention for forming circuitization in a circuit board comprising the following steps: providing a dielectric substrate; applying a positive photoresist to the dielectric substrate; then exposing the positive resist through art work corresponding to the desired circuit pattern; then developing the resist with an aqueous alkaline solution to form the circuit pattern in the resist; then applying a seeding composition to the patterned substrate of step d; exposing the remaining resist to actinic radiation; developing the remaining acidified resist with an aqueous alkaline solution to remove photoresist coated with seed to form a seed pattern; and then electrolessly plating metal onto the seed pattern so as to form the metallized circuit pattern.

DETAILED DESCRIPTION OF THE INVENTION

The method of the present invention is directed generally to the manufacturer of high density printed circuit boards using aqueous strippable resists. This method is applicable to electroless plating of metal, preferably copper, onto substrates including both organic and inorganic dielectric materials. Such dielectric materials comprise epoxy resins, ceramics and perfluorinated or chlorinated materials. The preferred substrate is made of a perfluorinated material. The substrate typically further has a layer of sacrificial copper disposed on the dielectric material and through holes or via disposed on or in the substrate, as desired, according to the circuit design.

The Method for Patterned Seeding

To form the metal circuitization on a substrate according to the method of the present invention, the surface is first optionally treated with a potassium anthracene solution that acts as an adhesion promoter for both the resist and seeding composition. A suitable potassium anthracene solution is 0.5 m potassium anthracene in NMP; other suitable potassium anthracene solutions are disclosed in U.S. Pat. No. 5,374,454 to Bickford et. al issued Dec. 20, 1994.

Next, an aqueous alkaline strippable resist, which is a resist capable of being removed from the substrate with an aqueous alkaline solution having a pH greater than about 8, is blanket coated onto the substrate. Both dry film and liquid types of aqueous alkaline strippable resists are suitable. Photosensitive resist materials are highly preferred. Suitable commercially available photosensitive resists include, for example, dry film resists available as RISTON 4700 and RISTON 4800 series from E.I. DuPont de Nemours Company, and AQUA-MER CF and AQUA-MER MP series from Hercules, Inc. Liquid resists include PHOTOPOSIT SP-20 from Shipley and RANTON 360 from Chemline. The resist layer is then patterned by first exposing the resist through art work to light at the appropriate wave length for the chosen photoresist. This light exposure causes carboxylic acids to form in the exposed portions of the photoresist, which are then removed, in the second development step. The photoresist is developed with a basic developer according to the resist manufacturers instructions. Suitable developers include, for example, sodium carbonate, potassium carbonate, alkali metal hydroxide solutions including for example, 0.2–0.3 M KOH solutions and 0.2–0.3 M sodium hydroxide solutions. As a result of the development, the pattern created in the resist corresponds to the desired circuit pattern.

Optionally, although preferably, a conditioner, such as a surfactant such as Polytech from Tecna Corporation or Reten from Hercules Corporation is blanket coated onto the substrate. The substrate, which requires no further washing, is then activated, that is seeded, by contact with a conventional seeding composition such as a seeding composition containing palladium chloride, HCL, and stannous chloride. The seed composition catalyzes the subsequent electroless copper deposition to the substrate. U.S. Pat. No. 4,448,804 to Amelio et al. issued May 15, 1995, describes the preferred Pd/Sn seed composition and Column 4 line 1 to Column 6 line 67 is incorporated herein by reference.

After the seed composition is deposited, the seeded substrate is blanket exposed to light at the appropriate wave length, to acidify the remaining photoresist. The substrate is then developed a second time using either the same developing solution as used in the first developing step or a different aqueous alkaline developing solution. As a result of the second developing step, the remaining resist is then developed and removed from the substrate. The remaining resist is removed and the seed that was deposited atop the resist is also removed. This second developing step has the further advantage of also accelerating the seed composition by removing some of the protective Sn from the surface of the seed deposit. It is not necessary to include a reducing agent in the developing solution.

As a result of the developing step, the seed is present on the substrate in a pattern which corresponds to the desired circuit pattern.

Next, the substrate is then contacted with conventional electroless plating bath preferably a copper plating bath. One such electroless copper plating bath is disclosed in U.S. Pat. No. 3,844,799 to Undkofler et al. The substrate is then removed from the bath. The metal is thus plated onto the patterned seed layer in the desired circuit pattern. All the seed is covered by the electrolessly plated metal; no unplated seed exists on the substrate after the electroless plating step.

The following example serves to illustrate the present invention and is not intended to limit the teachings as set forth herein.

EXAMPLE 1

Circuitization was formed in a perfluorinated substrate according to the following steps. First the substrate was treated with KAN-ETCH, that is a 0.5 M solution of potassium anthracene in NMP solution, for about 30 seconds. Next, the substrate was baked at 150° C. for about 30 minutes. A photoresist, Photoposit 20 from Shipley was applied by roller coating and exposed through art work to ultraviolet light at a wavelength of about 365 nm according to the manufacturer's instructions. The photoresist was developed with a 1% by weight, $NaCO_3$ solution having a pH of about 10, for about 180 seconds. Then the substrate was treated with 0.5% solution of Reten for about 2 minutes. Next the seed was deposited with the Pd colloidal solution disclosed in U.S. Pat. No. 4,448,804 to Amelio et al., for 180 seconds. The substrate was exposed to ultraviolet light at a wavelength of 365 nm for about 20 seconds then developed with the 1% $NaCO_3$ solution for about 180 seconds. The substrate was then electrolessly plated with copper in a conventional electroless bath.

EXAMPLE 2

Circuitization was formed in an epoxy resin substrate as in example 1, except that the substrate was not treated with KAN-ETCH, nor did it receive the 30 minute bake.

EXAMPLE 3

Circuitization was formed in a perfluorinated substrates in as in example 1, except that the accelerator second develop was 0.5 m NaOH solution.

The electrolessly plated workpieces/substrates of the above examples were evaluated for leakage; all the leakage values were about 0, that is there were no current leaks between the circuit lines.

Although certain embodiments of this invention have been shown and described, various adaptations and modifications can be made without departing from the scope of the invention as defined in the appended claims.

What is claimed is:

1. A method for forming circuitization in a circuit board comprising the following steps:
   a. providing a dielectric substrate;
   b. applying a positive photoresist to the dielectric substrate;
   c. then exposing the positive photoresist through art work corresponding to a desired circuit pattern;
   d. then developing the positive photoresist with an aqueous alkaline solution to form the desired circuit pattern in the remaining photoresist;
   e. then applying a seeding composition to the patterned dielectric substrate of step d;
   f. exposing the remaining photoresist to actinic radiation;
   g. developing the remaining photoresist with an aqueous alkaline solution to remove the remaining photoresist not coated with seed to form a seed pattern;
   h. electrolessly depositing metal onto the seed pattern so as to form a metallized circuit pattern corresponding to said desired circuit pattern; wherein, the dielectric substrate is treated with an adhesion promoter before applying said positive photoresist.

2. The method of claim 1 wherein the electrolessly depositing metal is copper.

3. The method of claim 1 wherein the adhesion promoter is potassium anthracene.

4. The method of claim 1 further comprising the step of treating the dielectric substrate with a conditioner before step e.

5. The method of claim 1 further comprising the step of treating the substrate with a conditioner before step e.

* * * * *